United States Patent [19]

Ibok

[11] Patent Number: 6,080,682
[45] Date of Patent: Jun. 27, 2000

[54] METHODOLOGY FOR ACHIEVING DUAL GATE OXIDE THICKNESSES

[75] Inventor: Effiong E. Ibok, Sunnyvale, Calif.

[73] Assignee: Advanced Micro Devices, Inc., Sunnyvale, Calif.

[21] Appl. No.: 08/993,716

[22] Filed: Dec. 18, 1997

[51] Int. Cl.[7] .......................... H01L 21/31; H01L 21/469
[52] U.S. Cl. .......................... 438/770; 438/197; 438/766; 438/775
[58] Field of Search ..................................... 438/775, 776, 438/777, 769, 591, 423, 758, 761, 762, 770, 766, 197

[56] References Cited

U.S. PATENT DOCUMENTS

| | | |
|---|---|---|
| 4,849,376 | 7/1989 | Balzan et al. ........................... 437/228 |
| 5,057,449 | 10/1991 | Lowrey et al. . | |
| 5,330,920 | 7/1994 | Soleimani ................................. 438/703 |
| 5,780,346 | 7/1998 | Arghanvani et al. .................... 438/296 |
| 5,882,993 | 3/1999 | Gardner et al. . |
| 5,918,133 | 6/1999 | Garder et al. . |
| 5,960,319 | 9/1999 | Iwata et al. . |

OTHER PUBLICATIONS

Wolf et al. "Silicon Processing for the VLSI Era vol. 1—Process Technology," Lattice Press. Sunset Beach, CA (1986) p. 532–534.

*Primary Examiner*—Charles Bowers
*Assistant Examiner*—Evan Pert

[57] ABSTRACT

Dual gate oxide layer thicknesses are achieved by depositing a thin blocking layer on active regions of a semiconductor substrate, such as silicon nitride, oxynitride, or oxide. Selected active regions are nitridated through a patterned photoresist mask formed thereon. The blocking layer protects the substrate from the photoresist mask and enables nitriding, as by ion implantation, plasma exposure, or rapid thermal annealing.

26 Claims, 8 Drawing Sheets

METHODOLOGY FOR ACHIEVING DUAL GATE OXIDE THICKNESSES

TECHNICAL FIELD

The present invention relates to manufacturing semiconductor devices having a plurality of operating voltages and, more particularly, to manufacturing ultra large scale integration and high density semiconductor devices with submicron design features and a plurality of gate oxide thicknesses.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional semiconductor technology for forming gate oxides.

Conventional semiconductor devices comprise a substrate having various electrically isolated regions, called active regions, in which individual circuit components are formed. The active region typically includes source/drain regions of a transistor formed in the semiconductor substrate or epitaxial layer, spaced apart by a channel region. A gate electrode for switching the transistor is formed on the channel with a gate oxide layer therebetween. The quality and thickness of the gate oxide are crucial for the performance and reliability of the finished device.

The speed of circuit components is affected by the time required to charge and discharge parasitic load capacitances In the circuit. Since a lower operating voltage results in a shorter time to charge and discharge the load capacitances, faster circuitry is typically attained by reducing the operating voltage. In order to reduce the operating voltage, however, the threshold voltage ($V_T$) of the transistor must also be lower. One way to lower the threshold voltage is to reduce the thickness of she gate oxide, which contributes proportionally to the body effect ($\gamma$) and, hence, the threshold voltage.

The reliability of circuit components is also affected by the thickness of the gate oxide. For example, if an excessive potential is applied to the gate electrode, the gate dielectric breaks down and causes a short circuit to occur between the gate electrode and typically the source of the transistor. The potential at which the gate dielectric breakdown occurs is termed the "breakdown voltage" and is related to the thicknesses of the gate oxide. Since the gate oxide must be thick enough to prevent gate dielectric breakdown, a higher operating voltage necessitates a thicker gate oxide to support a higher breakdown voltage.

Certain semiconductor devices have circuit components operating at different voltages. For example, a FLASH memory device comprises core circuitry that stores the memory bits and peripheral circuitry for decoding row and column addresses. As another example, speed-critical components of a microprocessor are typically operated at a lower voltage, but less speed-critical components of the microprocessor are operated at a higher voltage. For enhanced operating speed, it is desirable to operate the core circuitry at a fairly low voltage, such as about 1.8 V to about 2 V. In this situation, it is desirable to use relatively thinner gate oxides for the transistors. The peripheral circuitry, which is not speed-critical, however, is typically operated at a higher voltage, such as 5 V, for enhanced reliability due to relatively thicker gate oxides. For example, a gate oxide having a thickness of about 40 Å can be effective for circuitry running at about 1.8 V to about 2 V. However, circuitry operating at about 5 V can use a gate oxide region about 55 Å, about a third thicker and less susceptible to gate dielectric breakdown.

A typical, conventional approach to manufacturing gate oxides to different thicknesses is illustrated in FIGS. 1A through 1F. In FIG. 1A a semiconductor substrate 100 is prepared according to known techniques comprising doped, monocrystalline silicon or an epitaxial layer formed thereon. The thermal oxide layer 102 is formed on the substrate 100 typically as a by-product of creating field oxide isolation structure 104, as by etching and filling a shallow trench as depicted in FIG. 1A or by local oxidation of silicon (LOCOS). The field oxide isolation structure 104 separates and electrically isolates active region 106 from active region 108. In this example, active region 106 is for the peripheral circuitry of a FLASH memory and, hence, will have a thicker gate oxide; core active region 108, on the other hand, will have a thinner gate oxide.

Referring to FIG. 1B, a photoresist mask 110 is deposited on thermal oxide layer 102 and patterned, as by photolithography, to create an opening 112 under which the active region 108 requiring the thinner gate oxide is to be formed. The opening 112 comprises vertically aligned side walls 114 in the photoresist mask 110 and a bottom surface exposing a portion 116 of the thermal oxide layer 102.

Referring to FIG. 1C, the area 120 of the core active region 108 immediately below the main surface of the substrate 100 is nitridated by ion implantation of nitrogen through opening 112 of the mask 110 and through the exposed thermal oxide portion 116. The mask 110 protects the peripheral active region 106 from the nitrogen implantation. The result of the nitrogen implantation step, illustrated in FIG. 1D, is a nitridated area 120 in the core active region 108 below the exposed thermal oxide portion 116. Ion implantation damages the crystal lattice of the substrate 100 and, hence, lowers the quality of gate oxides grown thereon. Although the wafer may be annealed to repair the implantation damage, the attendant loss of implanted nitrogen into the thermal oxide portion 116 is considerable, greatly reducing the effectiveness of the nitrogen implantation.

Referring to FIG. 1E, the photoresist is stripped and the thermal oxide layer including portion 116 is removed, leaving isolation structure 104, core active region 108, and peripheral active region 106. At this point, illustrated in FIG. 1F, gate oxide is grown on the active regions by thermal oxidation. In the core active region 108, the nitridated area 120 retards the thermal oxidation rate, resulting in a thin gate oxide 130. On the other hand, in the peripheral active region 106, the thermal oxidation rate is not retarded by implanted nitrogen, having been protected by mask 110, resulting in a thicker gate oxide 132. In sum, the conventional approach to manufacturing semiconductor devices with dual gate oxide thicknesses is to selectively implant nitrogen through the thermal oxide layer 102, allowing thinner gates oxides to be grown in nitridated active regions.

A disadvantage with the conventional method of nitrogen implantation through a thermal oxide is that the thermal oxide layer typically lacks uniformity in thickness. Consequently, it is difficult to control the ion implantation of nitrogen to achieve the desired concentration of nitrogen atoms near the surface of the substrate. For example, at thinner areas of the thermal oxide, nitrogen atoms may be implanted too deeply, over which the gate oxide may be grown too thick, reducing production throughput and yield.

Conventionally, the thermal oxide layer is not stripped to expose the main surface of the substrate to a more consistent nitrogen implantation. A deposited photoresist mask is difficult to remove from the silicon substrate. Stripping the photoresist mask typically leaves some residue contamination on the substrate which adversely affects the quality of the gate oxide grown thereupon, especially in ultra large scale integrated semiconductor circuits. As mentioned earlier, some amount of the implanted nitrogen is lost into the thermal oxide layer during annealing; however, if the thermal oxide layer is stripped to expose the main surface of the substrate and the wafer is annealed, the attendant nitrogen loss is significantly and disadvantageously increased. In fact, the loss of nitrogen due to annealing may result in bubbling, which physically damages the surface of the substrate and, hence, degrades the gate oxide formed thereon.

There are also disadvantages associated with conventional techniques of nitriding other than implantation, such as exposure to an atmosphere containing nitrogen in the form of ammonia ($NH_3$), nitric oxide (NO), or nitrous oxide ($N_2O$). With these techniques, the thermal oxide portion 116 beneath the opening 112 in the photoresist mask 110 is etched off to expose the main surface of the substrate 100, which subsequently reacts to the nitrogen in the nitriding atmosphere to create a very thin nitrogen-rich layer. A difficulty occurs, however, when the thermal oxide layer is etched off, because the nitridated layer is also removed by the etching at about the same rate. If, however, the thermal oxide layer is first stripped prior to nitriding, then the photoresist mask is deposited directly on the silicon substrate, thereby contaminating the substrate over which the gate oxide is grown and reducing the reliability of the semiconductor device.

DISCLOSURE OF THE INVENTION

There exists a need for a more reliable and consistent method of nitridating the surface of a silicon substrate. Specifically, there is need for nitriding without causing photoresist to come in direct contact with the silicon substrate.

There is also a need to improve the consistency and reliability of nitrogen implantation, especially by enabling an annealing step to be performed without excessive loss of implanted nitrogen. A need also exists for effectively employing the non-implantation methods of nitriding.

Additional needs, objects, advantages, and other features of the present invention will be set forth in part in the description which follows and in part will become apparent to those having ordinary skill in the art upon examination of the following or may be learned from the practice of the invention. The needs, objects, and advantages of the present invention may be realized and obtained as particularly pointed out in the appended claims.

Accordingly, one aspect of the present invention is a method of manufacturing a semiconductor device, which method comprises: depositing a blocking layer on a main surface of a semiconductor substrate or of an epitaxial layer formed thereon; providing a mask on the blocking layer, said mask containing a pattern having an opening; nitridating a section of the main surface beneath the opening; removing the blocking layer; and forming a gate oxide over the nitridated section of the main surface. The blocking layer advantageously allows the photoresist to be deposited without coming into direct contact with the silicon substrate.

Another aspect in accordance with the present invention is a method of manufacturing a semiconductor device, comprising: depositing a blocking layer comprising nitrogen on a main surface of a semiconductor substrate or of an epitaxial layer formed thereon; providing a photoresist mask on the blocking layer, said mask containing a patterning having an opening; implanting nitrogen through the blocking layer into a section of the main surface beneath the opening in the mask; annealing the substrate to repair damage to the substrate by implantation; removing the blocking layer; and forming a gate oxide over the nitrogen implanted section of the main surface. By depositing a blocking layer comprising nitrogen, e.g. as a nitride or oxynitride, damage to the substrate after implantation can advantageously be annealed without excessive nitrogen loss. Moreover, the thickness and type of the blocking layer can be advantageously tailored to have peak nitrogen concentration at the main surface of the silicon substrate.

Yet another aspect of the present invention is a method of manufacturing a semiconductor device, comprising: depositing a blocking layer to a thickness of about 50 Å to about 100 Å on a main surface of a semiconductor substrate or of an epitaxial layer formed thereon; providing a photoresist mask on the blocking layer, said mask containing a patterning having an opening; etching to remove a portion of the blocking layer beneath the opening in the mask to expose a section of the main surface beneath the opening in the mask; stripping the photoresist mask; forming a thin, nitrogen-rich layer to a thickness of about 10 Å to about 15 Å on the exposed section of the main surface; removing the blocking layer, thereby leaving a portion of the thin, nitrogen-rich layer; and forming a gate oxide over the portion of the thin, nitrogen-rich layer. By forming a thin blocking layer by PECVD, the blocking layer can advantageously be etched much faster than the conventional thermal oxide layer, leaving a nitrogen-rich area at the main surface of the silicon substrate after the blocking layer is removed.

Additional needs, objects, and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention addresses and solves problems, such as reliability concerns, associated with conventional nitriding techniques by stripping the thermal oxide layer formed during the creation of the isolation structures and depositing a thin blocking layer, as by plasma enhanced chemical vapor (PECVD). A photoresist layer is then deposited thereon, advantageously prevented by the blocking layer from direct contact with the silicon substrate. The photoresist layer is then patterned to form a mask for nitriding of selected active regions, either by ion implantation, exposure to an ammonia plasma, or rapid thermal anneal in a nitrogen atmosphere, e.g. containing ammonia, nitric oxide, or nitrous oxide.

The blocking layer typically comprises silicon nitride, oxynitride, or oxide, and is deposited to a depth of about 50 Å to about 100 Å by PECVD. The optimum depositing conditions can be determined in a particular nitration. For example, according to an embodiment of the present invention, a nitride blocking layer is deposited by PECVD at a power of about 250 W to about 350 W, at a temperature of about 400° C. or less, and at a pressure of 1 Torr or less, while feeding silane ($SiH_4$) at a rate of about 50 sccm or less and ammonia ($NH_3$) at a rate of about 100 sccm or less. According to another embodiment, an oxynitride blocking layer is deposited by also feeding nitrous oxide ($N_2O$) at a rate of about 50 sccm or less. In yet another embodiment, the blocking layer comprises mainly silicon dioxide, deposited by PECVD at a power of about 250 W to about 350 W, at a temperature of about 400° C. or less, and at a pressure of 1 Torr or less, while feeding silane ($SiH_4$) at a rate of about 50 sccm or less and nitrous oxide ($N_2O$) at a rate of about 50 sccm or less.

Figure 1A:
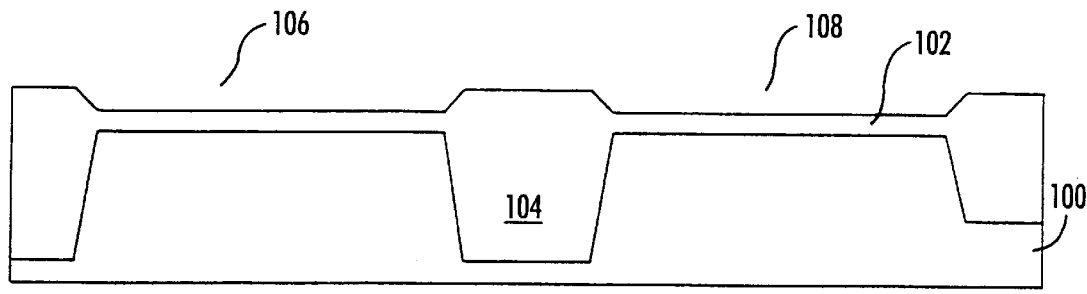
FIGS. 1A through 1F schematically illustrate sequential phases of manufacturing gate oxides to respective thicknesses according to a conventional method.
Figure 1B:
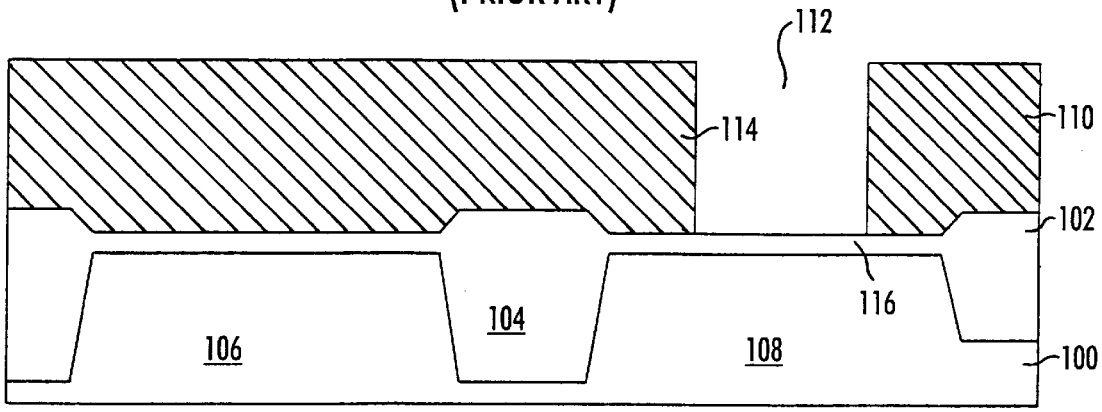
Figure 1C:
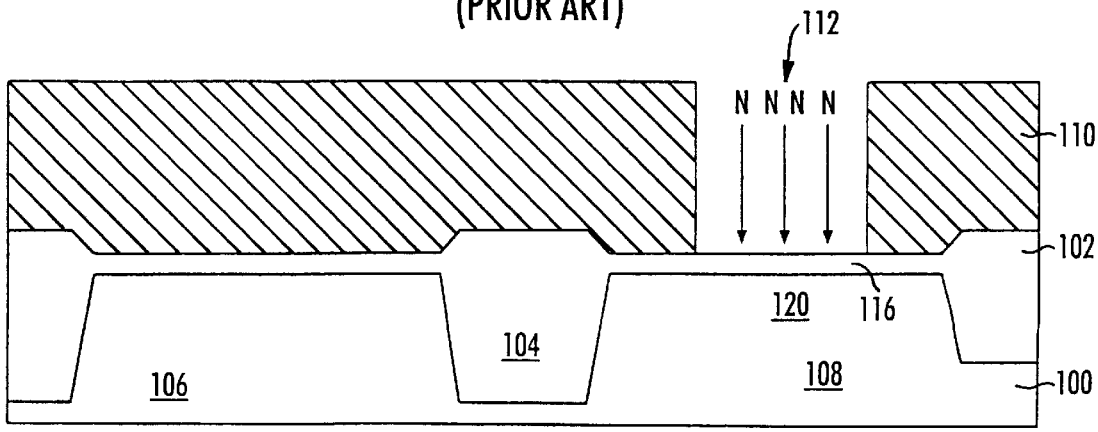
Figure 1D:
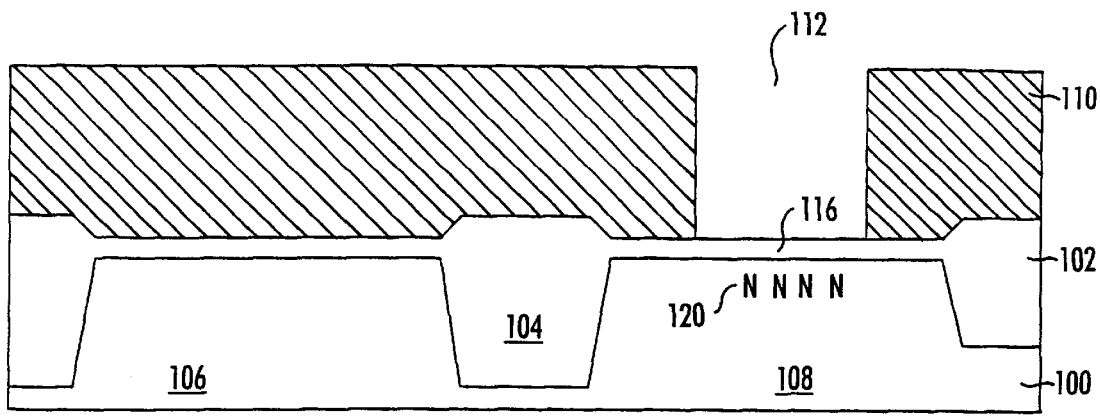
Figure 1E:
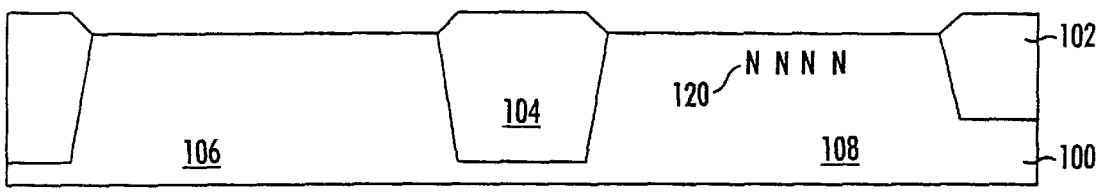
Figure 1F:
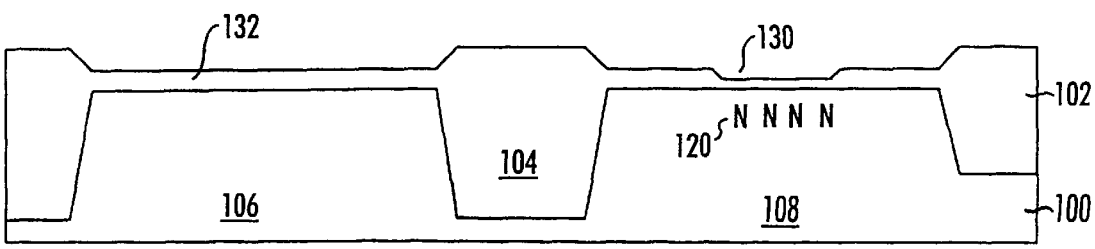
Figure 2A:
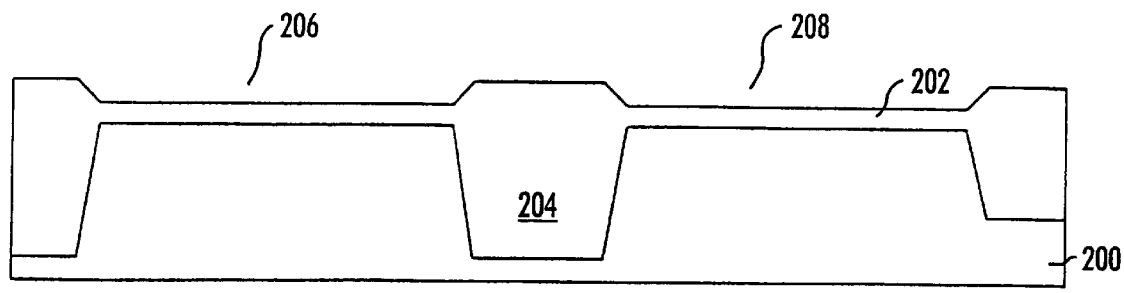
FIGS. 2A through 2I schematically illustrate sequential phases of manufacturing gate oxides to respective thicknesses according to one embodiment of the present invention.

An embodiment of the present invention, in which the nitriding is performed by nitrogen implantation, is schematically illustrated in FIGS. 2A through 2I, wherein similar elements bear similar reference numerals. Referring to FIG. 2A, a substrate 200 is prepared, typically a semiconductor substrate comprising doped monocrystalline silicon or an epitaxial layer formed on a silicon substrate in accordance with conventional practices. Formed on top of the substrate 200 is remaining thermal oxide layer 202 from creating field oxide isolation structure 204. While the field oxide isolation structure 204 depicted in FIG. 2A is a shallow trench that has been etched into substrate 200 and filled with an oxide, the field oxide isolation structure 204 can also be formed by other conventional techniques, such as LOCOS. The field oxide isolation structure 204 physically separates and electrically isolates active region 206 from active region 208. In the depicted embodiment, active region 206 is intended for the peripheral circuitry of a FLASH memory, and active region 208 is intended for the core circuitry of the FLASH memory. Thus, the peripheral active region 206 may have its gate oxide grown to a thickness of about 55 Å, and the core active region 208 may have its gate oxide grown to about 40 Å in thickness. While the present invention is illustrated by reference to a FLASH memory device, it is evident that the present invention is readily applicable to other semiconductor devices having circuit components operating at different voltages, such as microprocessors.

Figure 2B:
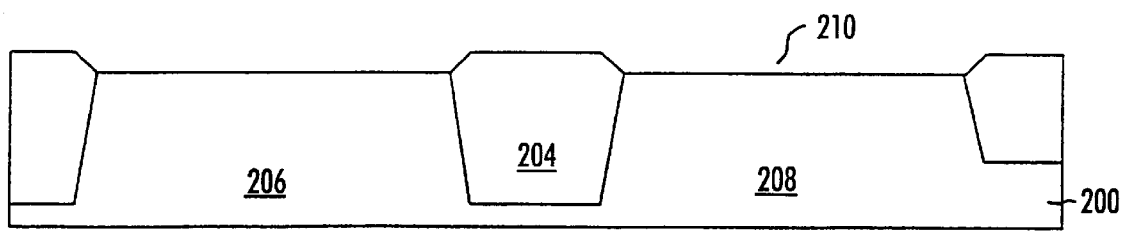

Referring to FIG. 2B, the thermal oxide layer 202 over the active regions is stripped exposing the main surface 210 of the substrate 200, as by dipping in an aqueous hydrofluoric acid (HF) solution. The strength of the acid solution can be optimized for a particular situation, and typically ranges from about 40 parts water to 1 part HF up to 10 parts water to 1 part HF. The field oxide region 204 may experience some loss in thickness during the HF acid dip.

Figure 2C:
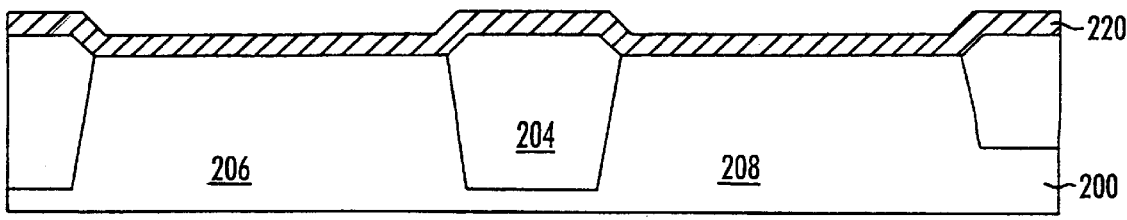

Referring to FIG. 2C, a thin blocking layer 220 is deposited over the wafer, including the active regions 206 and 208 as well as the field oxide region 204. The blocking layer 220 may be formed to a thickness of about 50 Å to about 100 Å by PECVD at a power of about 250 W to about 350 W, at a temperature of about 400° C. or less, and at a pressure of 1 Torr or less, while feeding silane ($SiH_4$) at a rate of about 50 sccm or less and ammonia ($NH_3$) at a rate of about 100 sccm or less, and, to create an oxynitride, nitrous oxide ($N_2O$) at a rate of about 50 sccm or less. Significantly, the blocking layer 220 contains nitrogen, for example, as nitride or oxynitride, which diminishes the nitrogen segregation during annealing from the substrate 200 to the blocking layer 220. Therefore, the present invention advantageously enables the implant damage in the substrate 200 to be annealed out without excessive loss of implanted nitrogen, thereby improving the quality of gate oxides grown thereon.

Since the blocking layer 220 is specifically deposited for the nitrogen implantation and is not a by-product of a previous step, the thickness and material of the blocking layer 220 can be advantageously tailored to have a peak nitrogen concentration at the main surface of the silicon substrate 200. While the particular parameters of the thickness and material of the blocking layer 200 will depend on the particular manufacturing environment and equipment, it is evident that the present invention provides significantly increased control over the concentration and depth of nitrogen implantation as compared to conventional approaches.

Figure 2D:
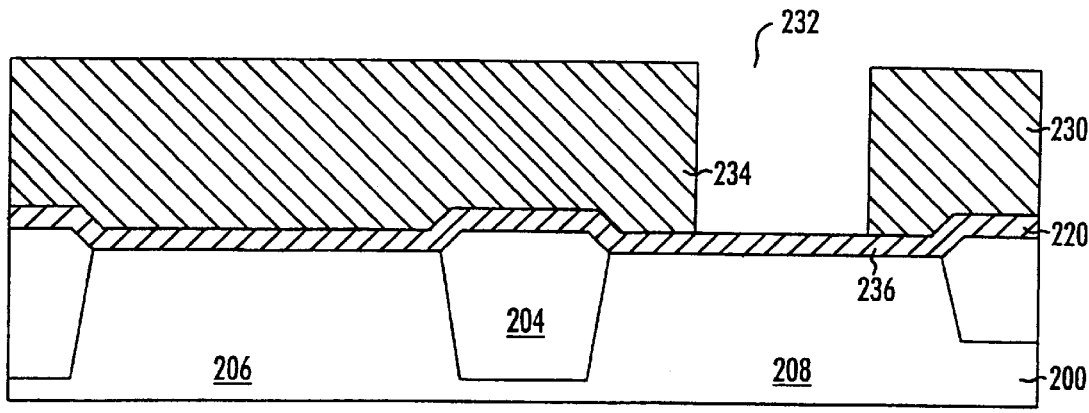

Referring to FIG. 2D, photoresist 230 is deposited on the blocking layer 220, which prevents direct contact between the photoresist 230 and the substrate 200. Accordingly, the photoresist 230 can be subsequently stripped without leaving residue contamination on the substrate 200, which deteriorates the quality of gate oxide formed thereon. The photoresist 230 is then patterned employing conventional photolithographic techniques such as masking, to create an opening 232 over core active region 208 requiring a thinner gate oxide. The opening 232 in the photoresist mask 230 has vertically aligned side walls 234 and a bottom surface 236 exposing a portion 236 of the blocking layer 220.

Figure 2E:
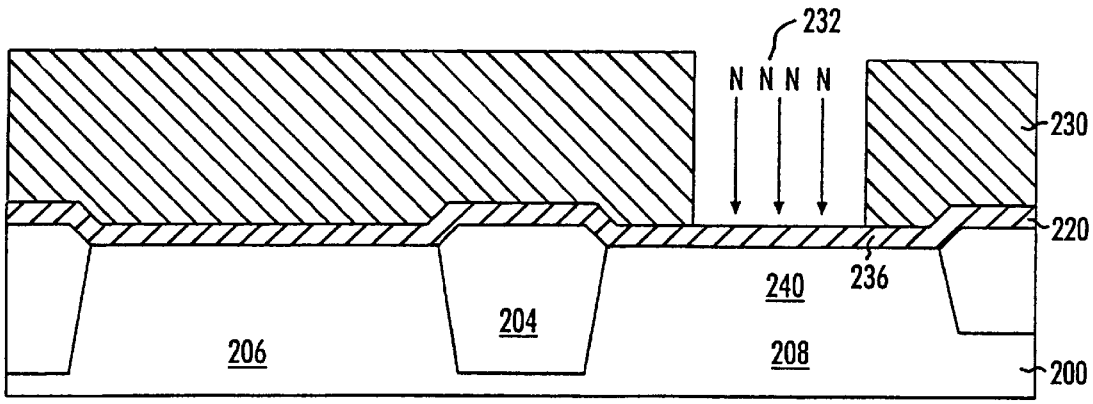
Figure 2F:
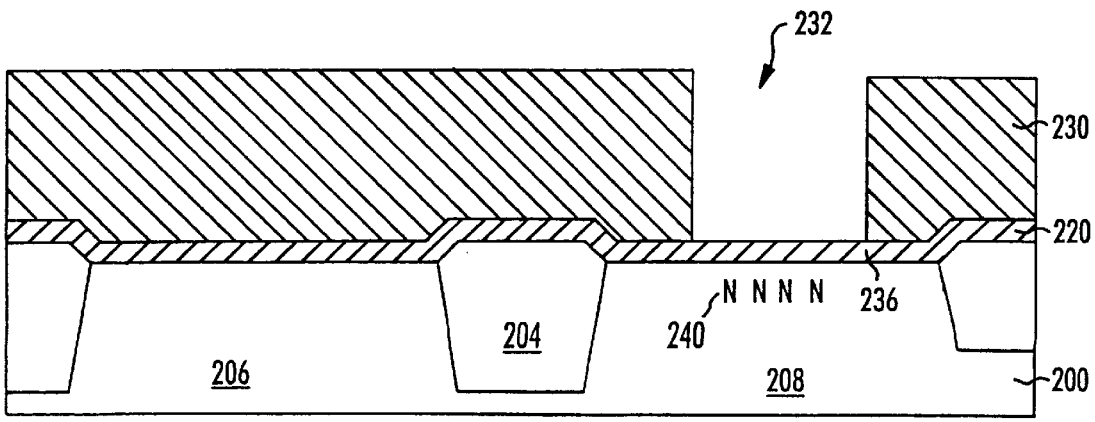

Referring to FIG. 2E, nitrogen is implanted through opening 232 in the mask 230 and through the portion 236 of the blocking layer 220 into an area 240 at the main surface of the substrate 200 in the core active region 208. Preferably, nitrogen is implanted to attain a concentration of about $10^{17}$ atoms/cm$^3$ to about $10^{20}$ atoms/cm$^3$. The peripheral active region 206 is protected from nitriding by the photoresist 230 deposited thereabove, specifically on the blocking layer 220 that protects the active regions 206 and 208 from contamination by the photoresist 230. The resulting nitridated area 240 at the main surface of the substrate 200, shown in FIG. 2F, is then annealed, as by rapid thermal annealing such as an isothermic rapid thermal annealing within a furnace. Unlike conventional practices, the wafer is preferably annealed to repair damage to the nitrogen implanted area 240, because the nitrogen-containing blocking layer 220 prevents excessive nitrogen loss.

Figure 2G:
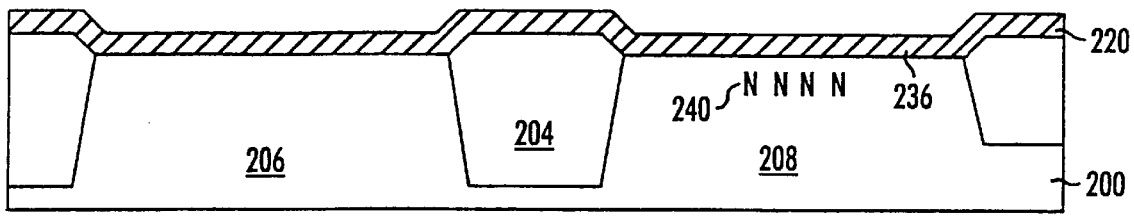
Figure 2H:
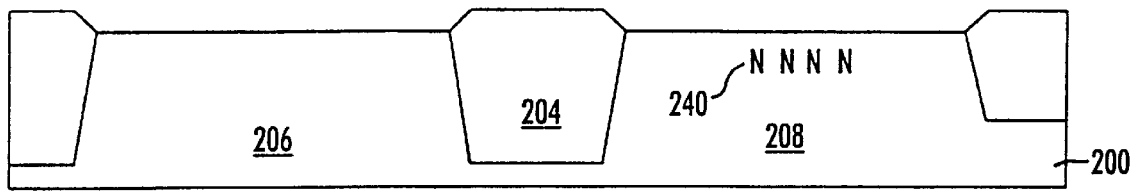

Referring to FIG. 2G, the photoresist mask 230 is stripped according to conventional cleaning methods to expose the blocking layer 220. Any remaining residue (not shown) of the photoresist 230 is affixed to the blocking layer 220 and not the substrate 200, especially at the peripheral active region 206 or the core active region 208, where gate oxide is later formed. The remaining photoresist residue is removed when the blocking layer 220 is stripped as shown in FIG. 2H. Any of a variety of conventional techniques can be employed to remove thin blocking layer 220 comprising silicon nitride, oxynitride, or oxide. For example, a method with a good throughput comprises dipping in an aqueous hydrofluoric (HF) solution, such as a 10% HF solution.

Figure 2I:
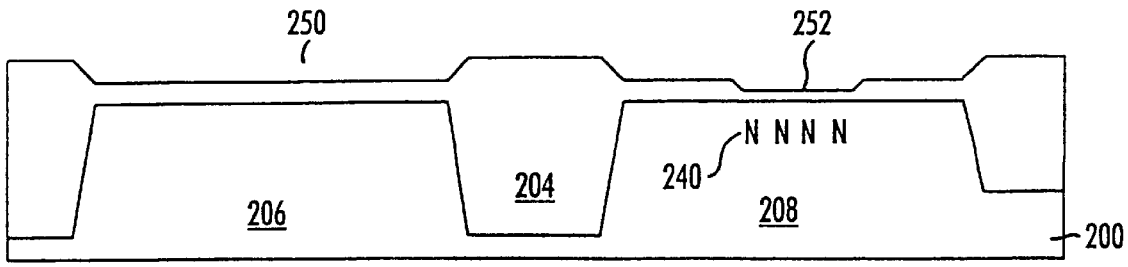

Referring to FIG. 2I, the gate oxide is grown by thermal oxidation according to conventional techniques, for example, dry oxidation. Since the peripheral active region 206 is protected by the photoresist mask 230 from nitriding, gate oxide 250 grows to a thickness, e.g. about 55 Å, appropriate for the higher operating voltages. The nitrogen in an area 240 of the main surface of the substrate in the core active region 208, on the other hand, retards the growth of gate oxide 252, so that the thickness of gate oxide 252 in a core active region 208 operating at a lower voltage can be thinner, eg. about 40 Å, than that of gate oxide 250.

Figure 3A:
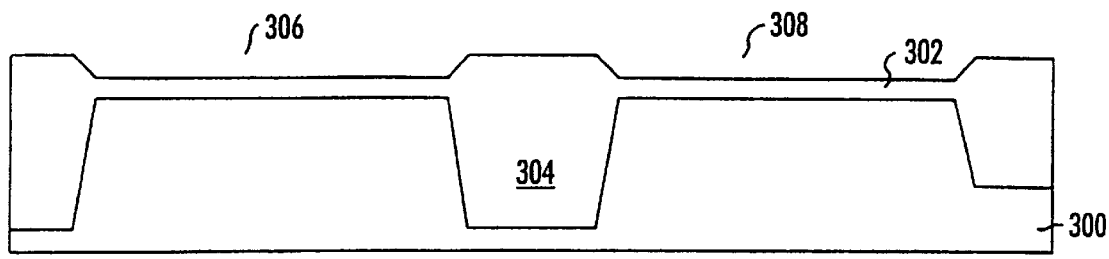
FIGS. 3A through 3H schematically illustrate sequential phases of manufacturing gate oxides to respective thicknesses according another embodiment of the present invention.

Another embodiment of the present invention, in which the nitration is performed by exposure to a nitrogen-containing atmosphere, is schematically illustrated in FIGS. 3A through 3H, wherein similar elements bear similar reference numerals. Referring to FIG. 3A, a substrate 300 is prepared, typically a semiconductor substrate comprising doped monocrystalline silicon or an epitaxial layer formed on a silicon substrate in accordance with conventional practices. Formed on top of the substrate 300 is a remaining thermal oxide layer 302 from creating field oxide isolation structure 304. While field oxide isolation structure 304 is depicted in FIG. 3A as a shallow trench isolation structure, etched into substrate 300 and filled with an oxide, the field oxide isolation structure 304 can also be formed by other conventional techniques, such as LOCOS. The field oxide isolation structure 304 physically separates and electrically isolates active region 306 from active region 308. In the depicted embodiment, active region 306 is intended for the peripheral circuitry of a FLASH memory, and active region 308 is intended for the core circuitry of the FLASH memory. Thus, the peripheral active region 306 may have its gate oxide grown to a thickness of about 55 Å, and the core active region 308 may have its gate oxide grown to about 40 Å in thickness. While the present invention is illustrated by reference to a FLASH memory device, it is evident that the present invention is readily applicable to other semiconductor devices having circuit components operating at different voltages, such as microprocessors.

Figure 3B:
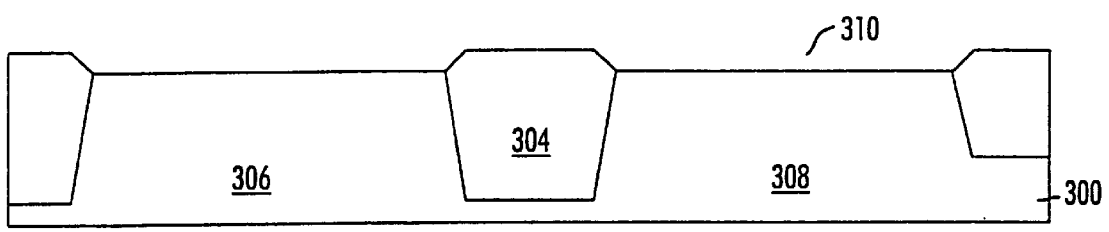

Referring lo FIG. 3B, the thermal oxide layer 302 over the active regions is stripped exposing the main surface 310 of the substrate 300, as by dipping in an aqueous hydrofluoric acid (HF) solution. The strength of the solution can range from about 40 parts water to 1 part HF up to 10 parts water to 1 part HF. The field oxide region 304 may experience some loss in thickness during the HF acid dip.

Figure 3C:
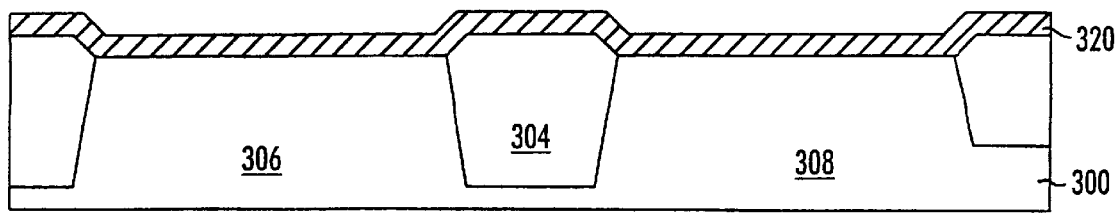

Referring to FIG. 3C, a thin blocking layer 320 is deposited over the wafer, including the active regions 306 and 308 as well as the field oxide region 304. The blocking layer 320 can be formed at an approximate thickness, such as about 100 Å or less, preferably about 50 Å, by PECVD at a power of about 250 W to about 350 W, at a temperature of about 400° C. or less, and at a pressure of 1 Torr or less, while feeding silane ($SiH_4$) at a rate of about 50 sccm or less and ammonia ($NH_3$) at a rate of about 100 sccm or less, and, to create an oxynitride, nitrous oxide ($N_2O$) at a rate of about 50 sccm or less. Significantly, the etch rate of the deposited blocking layer 320 is much faster, e.g. about six times faster, than thermally grown oxide or nitride.

Figure 3D:
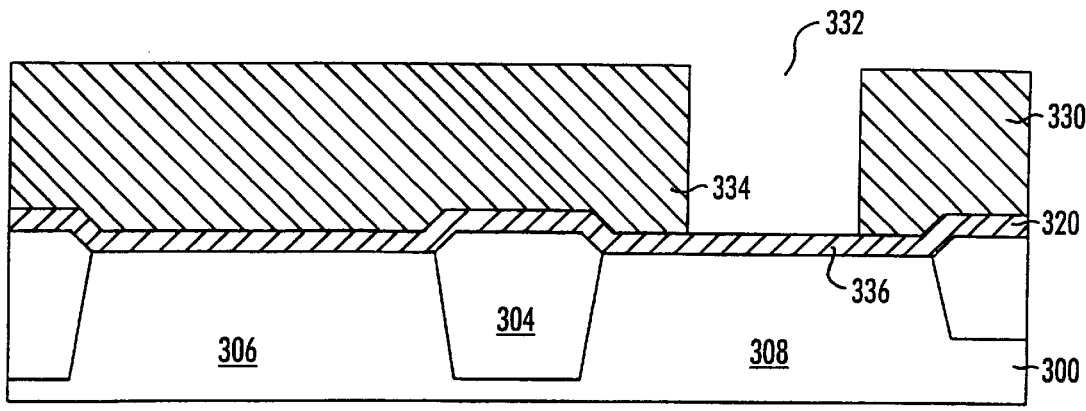

Referring to FIG. 3D, photoresist 330 is deposited on the blocking layer 320, which prevents direct contact between photoresist 330 and substrate 300. Accordingly, photoresist 330 can be subsequently stripped without leaving residue contamination on the substrate 300, which deteriorates the quality of gate oxide formed thereon. The photoresist 330 is then patterned employing conventional photolithographic techniques such as masking, to create an opening 332 beneath which is core active region 308 requiring a thinner gate oxide. The opening 332 in the photoresist mask 330 has vertically aligned side walls 334 and a bottom surface exposing a portion 336 of the blocking layer 320.

Figure 3E:
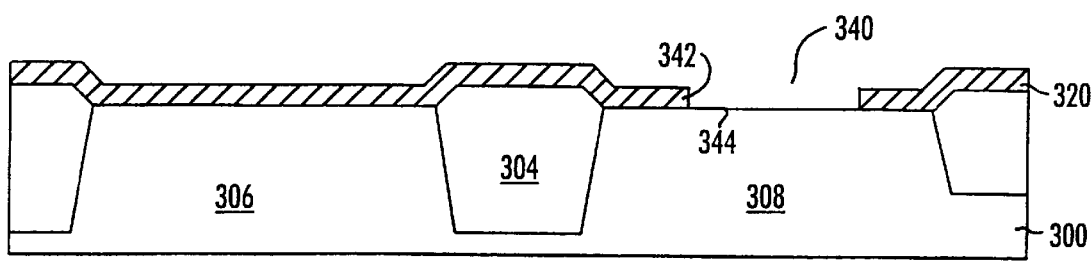

Referring to FIG. 3E, the blocking layer 320 is etched to create an opening 340, aligned within the opening 332 in the mask 330 and having a side surface 342 on the blocking layer 320 and a bottom surface 344 that exposes the main surface of the substrate 300 in the core active region 308. The portion of the blocking layer 320 overlying the peripheral active region 306, on the other hand, is not etched. The photoresist mask 330 is then stripped, leaving any residue (not shown) on the blocking layer 320 but not on the substrate 300.

Figure 3F:
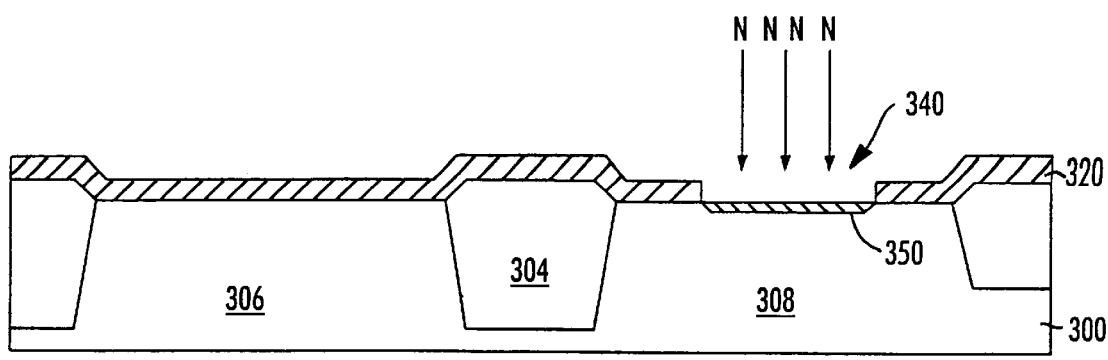

Referring to FIG. 3F, the exposed main surface 344 of the substrate 300 in the core active region 308 is heated and exposed to a nitrogen-containing atmosphere to create a nitrogen-rich layer, having a thickness preferably at least one-sixth of the thickness of the blocking layer 320, for example, about 10 Å to about 15 Å. According to an embodiment of the present invention, the exposed main surface 344 is subjected to a $NH_3$ plasma. The appropriate parameters for the $NH_3$ plasma exposure can be optimized for a given situation. For example, suitable $NH_3$ plasma exposure parameters include a power of 400 watts or less, a fixed flow rate for $NH_3$ of 100 sccm or less, a fixed flow rate for $N_2$ of 5000 sccm or less, and a pressure of 1 Torr or less. The resulting nitrogen-rich layer 350 in this embodiment comprises mostly silicon nitride.

According to other embodiments of the present invention, the main surface 344 is nitridated by a rapid thermal anneal in a nitrogen-containing atmosphere. In this embodiment, the wafer is quickly heated, e.g. in a single-wafer chamber, to a suitable temperature, such as about 1,050° C., for an appropriate period of time, such as about 30 seconds, while feeding a nitrogen-containing gas, such as $NH_3$, NO, or $N_2O$, at a rate of about 200 sccm. If the nitrogen-containing gas comprises $NH_3$, the resulting nitrogen-rich layer 350 comprises mostly silicon nitride. On the other hand, if the nitrogen-containing gas comprises oxygen, such as NO or $N_2O$, the resulting nitrogen-rich layer 350 comprises mostly silicon oxynitride.

Figure 3G:
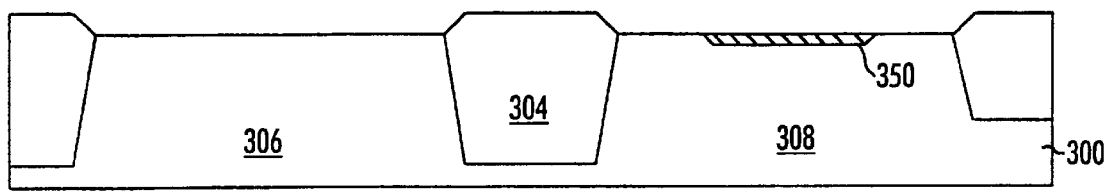

Referring to FIG. 3G, the remaining blocking layer 320 is stripped, as by dipping in an aqueous HF acid solution, e.g. 40 (water): 1 (HF) or 10 (water): 1 HF. The etch rate of the deposited blocking layer 320 is typically about six times faster than the thermally grown nitrogen-rich layer 350. Since the deposited blocking layer 320 is less than six times thicker than the thermally grown nitrogen-rich layer 350, the blocking layer 320 can be completely etched off without removing all of the nitrogen-rich layer 350. Consequently, some nitrogen-rich portion of the layer 350 remains at the main surface of the substrate 300 in the core active region. Therefore, deposition of a thin blocking layer 320 that can be etched more rapidly than a thermally grown nitridated layer 350 enables the use of nitriding techniques other than ion implantation, e.g. plasma exposure or rapid thermal annealing. By employing techniques other than nitrogen implantation, damage to the substrate 300 due to ion implantation is avoided, thereby enhancing the quality of gate oxide subsequently formed thereon.

Figure 3H:
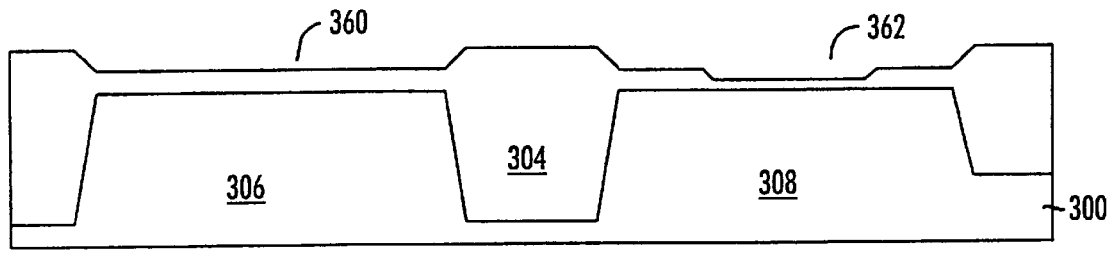

Referring to FIG. 3H, the gate oxide is grown by thermal oxidation according to conventional techniques, for example, dry oxidation. Since the peripheral active region 306 was protected by the photoresist mask 330 from nitriding, gate oxide 360 grows to a thickness, e.g. about 55 Å, appropriate for the higher operating voltages. The nitrogen in a layer 350 on the main surface of the substrate 300 in the core active region 308, on the other hand, retards the growth of gate oxide 362, so that the thickness of gate oxide 362 in a core active region 308 operating at a lower voltage can be thinner, eg. about 40 Å, than that of gate oxide 350.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices having a design rule less than about 0.25 micron, including less than about 0.18 micron.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, comprising:
    removing a thermal oxide layer from a main surface of a semiconductor substrate or of an epitaxial layer formed thereon;
    depositing a blocking layer on the main surface of the semiconductor substrate or of the epitaxial layer formed thereon, after removing the thermal oxide layer;
    providing a mask on the blocking layer, said mask containing a pattern having an opening;
    nitridating a section of the main surface beneath the opening;
    removing the mask;
    removing the blocking layer; and
    forming a gate oxide over the nitridated section of the main surface.

2. The method of claim 1, wherein the blocking layer has a thickness of about 50 Å to about 100 Å.

3. The method of claim 2, wherein the blocking layer comprises silicon oxide, silicon nitride, or silicon oxynitride.

4. The method of claim 3, wherein the blocking layer is deposited by plasma-enhanced chemical vapor deposition (PECVD).

5. The method of claim 1, wherein the mask comprises a photoresist mask.

6. The method of claim 1, comprising:
    etching to remove a portion of the blocking layer beneath the opening in the mask and to expose the section of the main surface beneath the opening in the mask; and
    nitridating the exposed main surface beneath the opening in the mask.

7. The method of claim 6, comprising forming a thin nitride layer at the exposed main surface beneath the opening in the mask.

8. The method of claim 7, wherein the thin nitride layer has a thickness of about 10 Å to about 15 Å.

9. The method of claim 8, wherein the thin nitride layer is formed by plasma exposure to ammonia ($NH_3$).

10. The method of claim 9, wherein the ammonia is fed at a rate of about 100 sccm, nitrogen gas is fed at a rate of about 5000 sccm.

11. The method of claim 8, wherein the thin nitride layer is formed by a rapid thermal anneal in an atmosphere containing ammonia ($NH_3$).

12. The method of claim 6, comprising forming a thin, nitrogen-rich oxide layer at the exposed main surface beneath the opening in the mask.

13. The method of claim 12, wherein the thin, nitrogen-rich oxide layer has a thickness of about 10 Å to about 15 Å.

14. The method of claim 13, wherein the thin nitrogen-rich oxide layer is formed by a rapid thermal anneal in an atmosphere containing nitric oxide (NO) or nitrous oxide ($N_2O$).

15. The method of claim 1, comprising implanting nitrogen through the blocking layer into the section of the main surface beneath the opening in the mask.

16. The method of claim 15, wherein the section of the main surface after implantation has a nitrogen concentration of about $10^{17}$ atoms/cm$^3$ to about $10^{20}$ atoms/cm$^3$.

17. The method of claim 1, wherein the blocking layer is removed by an aqueous hydrofluoric acid dip.

18. A method of manufacturing a semiconductor device, comprising:
    removing a thermal oxide layer from a main surface of a semiconductor substrate or of an epitaxial layer formed thereon;
    depositing a blocking layer to a thickness of about 50 Å to about 100 Å on the main surface of the semiconductor substrate or of the epitaxial layer formed thereon, after removing the thermal oxide layer;
    providing a photoresist mask on the blocking layer, said mask containing a patterning having an opening;
    etching to remove a portion of the blocking layer beneath the opening in the mask to expose a section of the main surface beneath the opening in the mask;
    stripping the photoresist mask;
    forming a thin, nitrogen-rich layer to a thickness of about 10 Å to about 15 Å on the exposed section of the main surface;
    removing the blocking layer, thereby leaving a portion of the thin, nitrogen-rich layer; and
    forming a gate oxide over the portion of the thin, nitrogen-rich layer.

19. The method of claim 18, wherein the blocking layer is deposited by a plasma enhanced chemical vapor deposition (PECVD) technique.

20. The method of claim 19, wherein the blocking layer comprises silicon oxide, silicon nitride, or silicon oxynitride.

21. The method of claim 20, wherein the thin, nitrogen-rich layer comprises nitride.

22. The method of claim 21, wherein the thin nitride layer is formed by plasma exposure to ammonia ($NH_3$).

23. The method of claim 22, wherein the ammonia is fed at a rate of about 100 sccm, nitrogen gas is fed at a rate of about 5000 sccm.

24. The method of claim 21, wherein the thin nitride layer is formed by a rapid thermal anneal in an atmosphere containing ammonia ($NH_3$).

25. The method of claim 20, wherein the thin nitrogen-rich layer is formed by a rapid thermal anneal in an atmosphere containing nitric oxide (NO) or nitrous oxide ($N_2O$).

26. The method of claim 20, comprising removing the blocking layer in an aqueous hydrofluoric acid dip.

* * * * *